(12) United States Patent
Mizutani

(10) Patent No.: US 7,362,214 B2
(45) Date of Patent: Apr. 22, 2008

(54) BRANCHING DEVICE FOR TRANSMISSION LINE AND MONITORING APPARATUS USING THE SAME

(75) Inventor: Tsutomu Mizutani, Ann Arbor, MI (US)

(73) Assignee: Aisin AW Co., Ltd., Anjo (JP)

( * ) Notice: Subject to any disclaimer, the term of this patent is extended or adjusted under 35 U.S.C. 154(b) by 227 days.

(21) Appl. No.: 11/092,666

(22) Filed: Mar. 30, 2005

(65) Prior Publication Data

US 2006/0226965 A1 Oct. 12, 2006

(51) Int. Cl.
*G05B 11/01* (2006.01)

(52) U.S. Cl. ............................... 340/310.11; 307/10.1; 340/2.8; 340/438

(58) Field of Classification Search ............... 340/2.8, 340/439, 438, 425.5, 310.11, 310.16, 286.02; 307/10.1; 701/33, 29, 36; 707/102; 700/275, 700/276; 62/133
See application file for complete search history.

(56) References Cited

U.S. PATENT DOCUMENTS 5,406,836 A * 4/1995 Smith ........................ 73/118.1

| | | | |
|---|---|---|---|
| 6,928,349 B1 * | 8/2005 | Namaky et al. | 701/33 |
| 6,972,554 B1 * | 12/2005 | Davis | 324/121 R |
| 2003/0018415 A1 * | 1/2003 | Sonobe et al. | 700/275 |
| 2003/0090152 A1 * | 5/2003 | Juntunen et al. | 307/10.1 |
| 2004/0153223 A1 * | 8/2004 | Fujita et al. | 701/29 |
| 2005/0043868 A1 * | 2/2005 | Mitcham | 701/29 |

FOREIGN PATENT DOCUMENTS

JP A-10-172699 6/1998

OTHER PUBLICATIONS

"CAN Specification: Version 2.0"; Robert Bosch GmbH; Sep. 1991.

* cited by examiner

*Primary Examiner*—Brent A. Swarthout
(74) *Attorney, Agent, or Firm*—Oliff & Berridge, PLC

(57) ABSTRACT

A branching device for a transmission line, including a main transmission line including at least two signal lines and having respective connectors provided at either end; a first branch transmission line which branches from the signal lines and which has a branch-use connector at an end; a second branch transmission line which branches from the signal lines and which has a branch-use terminal block at an end; a terminating resistor having one end connected to one of the signal lines; and a selection switch that switches the other end of the terminating resistor between connecting with an other one of the signal lines, and forming an open circuit.

16 Claims, 3 Drawing Sheets

BRANCHING DEVICE FOR TRANSMISSION LINE AND MONITORING APPARATUS USING THE SAME

BACKGROUND

1. Field

The disclosure relates to a branching device for a transmission line that transmits information, and to a monitoring apparatus that monitors information transmissions using the branching device.

2. Description of the Related Art

The development of advanced information-based society has been accompanied by increased use of information processing and transmission in numerous different fields, with a wide range of different systems being adopted. In the vehicle control field as well, it has become common to use electronic control units in which microcomputers are applied to control the engine, transmission and the like. Information indicating the operation state of various different devices within an automobile that is used in electronic control is necessary for when the vehicle is running. In addition, the information is also useful for (a) carrying out regular vehicle inspections, and (b) dealing with problems if they occur.

Recently, there has been a trend in the North American automobile market toward making the provision of a vehicle diagnostic service using Controller Area Network communication (CAN communication) a legally required duty. CAN communication is a widely used transmission system for transmitting information between various control devices within a vehicle. The diagnostic service is a service that reads information from the vehicle in order to provide assistance for vehicle inspections, maintenance, and identifying the cause of any abnormality that occurs. In order to provide the diagnostic service, a transmission device, known as a service tool, is attached to the vehicle at a dealer's maintenance center, or the like. The information that is read includes (i) general data concerning the vehicle's operation state, like the vehicle speed, the engine revolution speed, and the gear shift stage, and (ii) a code number called a diagnosis code that systematically classifies an abnormality. The diagnostic service allows maintenance staff to rapidly determine the area of the vehicle and the specific nature of any abnormality that has occurred.

SUMMARY

However, the development of vehicles, that comply with legal requirements for a diagnostic service, has been affected by various problems, and as a result development efficiency has been lowered. More specifically, when checking performance, there have been difficulties related to monitoring information transmission between the vehicle and the service tool. This is because each vehicle is only provided with a connector, for connecting to the transmission device, at a single location. Accordingly, it has been necessary to take the time and expense to modify vehicle wiring in order to connect a development-use monitoring device. Note that Japanese Patent Laid-Open Publication No. 10-172699 discloses a technology in which a connection apparatus for a transmission line is used to branch a transmission line. However, even if such a technology is used, it is necessary to use a special conversion adapter as it is not possible to directly connect the monitoring device because the shape of each connector varies depending on the vehicle make and type. Moreover, even if the monitoring device is connected, if a 120 kΩ terminating resistor, which is necessary for CAN communication, has not been fitted due to the vehicle still being under development, it is not possible to read the information.

Further, on some occasions, the entire vehicle is not used, and the various devices related to information transmission are connected in a bench test in which a dummy signal is transmitted from the monitoring device in order to check information transmission functions and the operation state of each device. However, in this case, because a terminating resistor is normally not provided, it is not possible to read the information. Moreover, sometimes, communication systems other than CAN communication are used. In such a case, depending on the devices that are being combined, it is necessary/unnecessary to incorporate a terminating resistor, and the resistance value of the terminating resistor may vary. As a result, it is necessary to go through the troublesome procedure of preparing, and attaching and removing a terminating resistor that matches that of the devices of the vehicle. Further, this procedure is a cause of monitoring and testing mistakes.

The invention has been conceived of in light of the above described problems, and provides a general-purpose branching device for a transmission line, and a monitoring apparatus that uses the branching device to monitor information transmission performed using a transmission line. The invention may be applied to a wide variety of information transmission systems. In addition, the branching device for a transmission line and the monitoring apparatus using the same can be applied to CAN communication between a vehicle and a service tool, thereby allowing vehicle development efficiency to be improved.

BRIEF DESCRIPTION OF THE DRAWINGS

The detailed description will be made with reference to the drawings, in which.

DETAILED DESCRIPTION OF PREFERRED EMBODIMENTS

Figure 1:
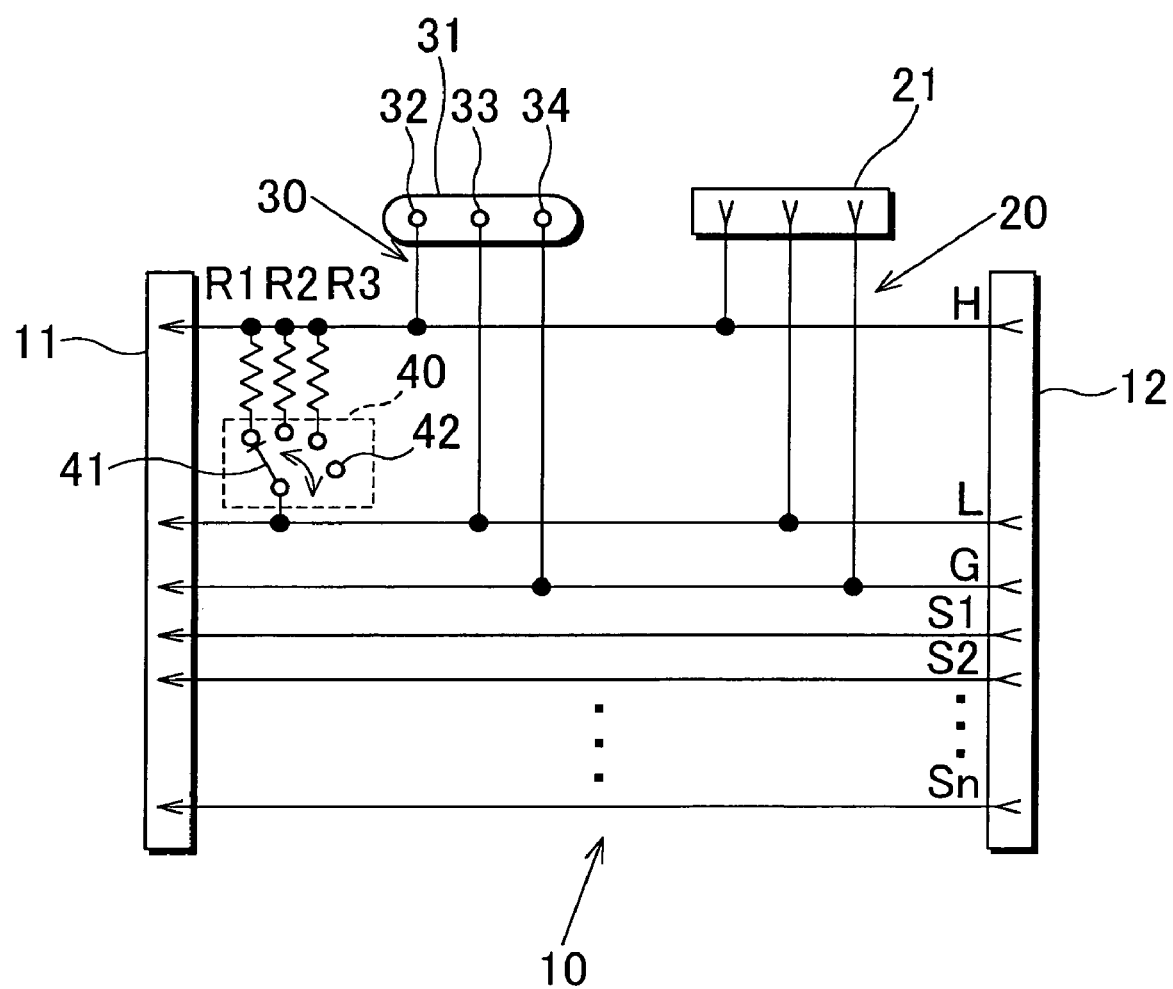
FIG. 1 is a connection diagram showing a branching device for a transmission line according to an embodiment of the invention.
Figure 2:
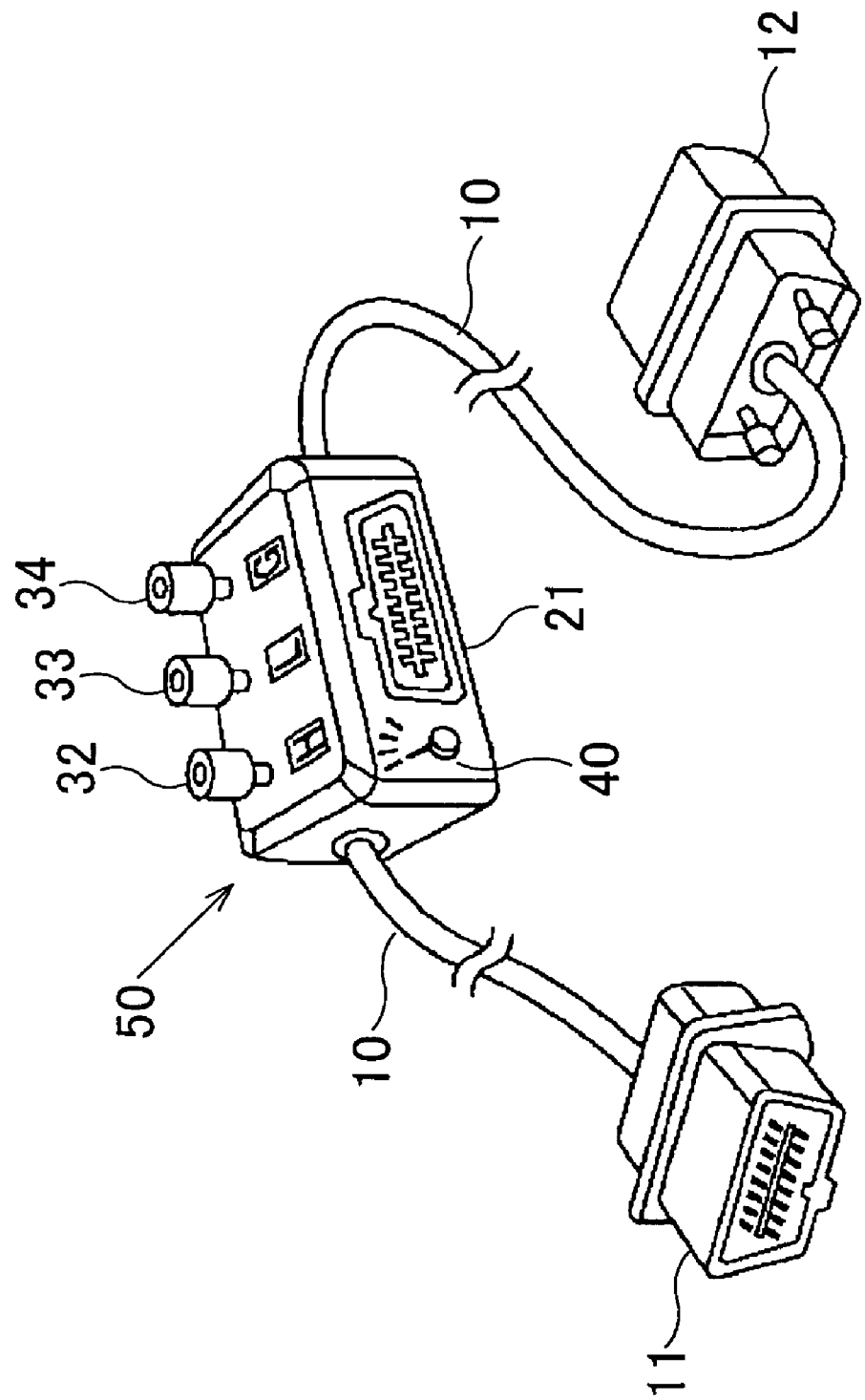
FIG. 2 is an explanatory diagram showing the configuration of the embodiment of FIG. 1.

A preferred embodiment will be described with reference to FIGS. 1 to 3. FIG. 1 is a connection diagram showing a branching device for a transmission line according to the embodiment. The explanation that will be given here is for a case when the invention is applied to vehicle-use CAN communication. The branching device of the embodiment includes a main transmission line 10; a first branch transmission line 20; a second branch transmission line 30; three terminating resistors R1 to R3; and a rotary switch 40.

The main transmission line 10 includes two signal lines H and L; a ground line G; and n number of parallel signal lines S1 to Sn. The signal lines H and L, and the ground line G are for CAN communication use, and the parallel wires S1 to Sn are used for other types of information transmission. A vehicle-use connector 11, which can be connected to a vehicle (not shown), is provided at one end of the main transmission line 10, and a service tool-use connector 12 is provided at the other end of the main transmission line 10. A service tool 93 can be connected to the connector 12.

The first branch transmission line 20 is formed from branch wires of the main transmission line 10, namely, branch wires of the two signal lines H and L, and the ground line G. Further, a branch-use connector 21, which can be connected to a monitoring apparatus 94, is provided at the end the first branch transmission line 20.

The second branch transmission line 30 is also formed from branch wires of the main transmission line 10, namely, branch wires of the two signal lines H and L and the ground line G. A branch-use terminal block 31 is provided at the end of the second branch transmission line 30. The terminal block 31 has branch-use terminals 32, 33, 34 to which an alligator clip, an amp terminal, or a bare signal line may be connected.

The resistance values of the three terminating resistors R1 to R3 are different, with that of the terminating resistor R1 being 120 kΩ. Each of the terminating resistors R1 to R3 has one end connected to the signal line H, and the other end attached to a rotary switch 40.

The rotary switch 40 has a rotatable selection switch 41 with a fixed end that is always connected to the signal line L. As the movable end of the rotatable selection switch 41 is rotated, it is connected, in order, to the respective other ends of the terminating resistors R1 to R3, and is finally connected to an open terminal 42 that is electrically isolated. Accordingly, the rotary switch 40 can be turned to (a) one of the terminating resistors R1 to R3 to terminate between the signal line H and the signal line L, or (b) to the open circuit position to form an open circuit.

Next, a configuration that embodies the connection diagram of the above-described branching device of the embodiment will be explained with reference to FIG. 2, which is an explanatory diagram showing the configuration of the branching device of the embodiment. The branching device includes the main transmission line 10, the connectors 11 and 12 at respective ends thereof, and a relay unit 50.

The main transmission line is a multi-core line in which the two signal lines H, L, the ground line G, and the n number of parallel signal lines S1 to Sn are bundled together. The connectors 11, 12 are provided at the respective ends of the main transmission line 10. The connectors 11, 12 have sixteen pins that serve as connection points. However, if necessary, connectors may be used that have a different number of connection points, for example, in the case that there is a large number of parallel signal lines S1 to Sn.

The relay unit 50 contains the first branch transmission line 20, the second branch transmission line 30, the three terminating resistors R1 to R3, and the rotary switch 40, which were described previously with reference to the connection diagram of FIG. 1. The relay unit 50 has a generally box-shaped housing, which the main transmission line 10 passes through. Further, at two points within the relay unit 50, the two signal lines H and L, and the ground line G are branched, and connected to the branch-use connector 21 and the three branch-use terminals 32, 33 and 34 that are mounted on the surface of the casing. The three terminating resistors R1 to R3 are wired and connected within the casing. The rotary switch 40 is mounted on the surface of the casing so that switching between the terminating resistors R1 to R3, and the open circuit can be performed from the outside.

Next, use and operation of the branching device of the embodiment when applied to vehicle CAN communication will be described. The branching device according to the embodiment is used by connecting the vehicle-use connector 11 to the vehicle, the service tool-use connector 12 to the service tool 93, and the branch-use connector 21 to the monitoring apparatus 94. At this time, the rotary switch 40 is turned to the open circuit position because, generally, the connection with the vehicle is to a 120 kΩ terminating resistor. It should be noted that, in this embodiment, the service tool-use connector 12 and the branch-use connector 21 have the same shape. Accordingly, the connections of the service tool 93 and the monitoring apparatus 94 may be switched, or, alternatively, just one of the devices may be connected.

Figure 3:
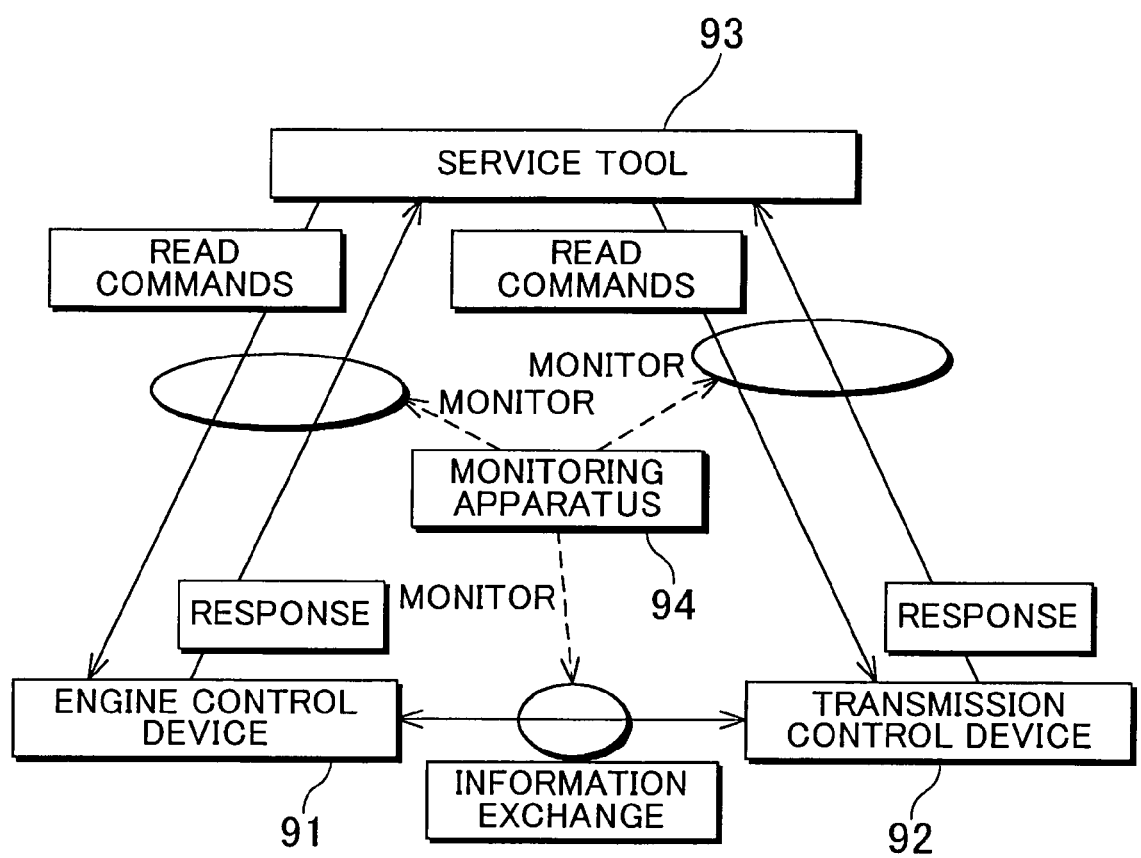
FIG. 3 is a block chart illustrating the information transmission function of the embodiment of FIG. 1.

FIG. 3 is a block chart illustrating the information transmission function when the above described connections are made. Note that, an electronically controlled engine control device 91 and a transmission control device 92 are mounted in the vehicle. During information transmission, first, a read-out command is sent from the service tool 93, and then responses are returned from the engine control device 91 and the transmission control device 92. More specifically, the responses include (1) general data about the vehicle's operation state like the vehicle speed, the revolution speed of the engine, the respective revolution speeds of shafts of various structural elements, the respective torques of the structural members, the range of the shifting device, the gear shift stage, and (2) a code number called a diagnosis code that systematically classifies the abnormality. The monitoring apparatus 94 connected via the branching device according to the invention is able to monitor both (i) the read-out commands and the responses, and (ii) information exchange between the control devices 91, 92 within the vehicle.

Moreover, on some occasions during the development process, instead of using the entire vehicle, the control devices 91, 92 alone are connected in a bench test in which the information transmission functions and the operation state of each device are checked. At this time, it is confirmed if a terminating resistor is connected to the device that is being tested, and in the case that no terminating resistor is connected, the rotary switch 40 is set to the terminating resistor R1 (namely, 120 kΩ) so as to connect the device in advance. Accordingly, it is possible to perform information transmission in a normal manner. Moreover, even when the service tool 93 cannot be connected, it is possible to transmit a dummy signal that corresponds to the read-out command from the monitoring apparatus 94, and perform testing in this manner.

Furthermore, instruments and testing devices other than the monitoring apparatus 94 may be connected to the branch-use terminals 32, 33, 34. For example, a noise generation device may be connected in order to evaluate noise immunity by deliberately superimposing noise on the signal lines. In addition, the branching device of the invention may also be favorably used in special tests that are difficult to perform during normal usage.

The branching device according to the embodiment may be applied to CAN communication between a vehicle and a service tool, thus enabling read-out commands and responses to be monitored. Accordingly, it is not necessary to modify the vehicle's wiring, or go through the troublesome procedure of preparing and attaching and removing a terminating resistor. Moreover, it is possible to perform test verifications adequately even if only some of the devices of the vehicle are combined, and also perform specialist testing. As a result, vehicle development can be carried out efficiently.

The branching device for a transmission line can be applied to CAN communication between a vehicle and a service tool, as well as to a wide variety of other transmission systems.

In summary, the branching device includes a main transmission line which physically connects two devices that transmit information between each other. The main transmission line normally includes two signal lines that use serial transmission in which information is transmitted sequentially. Moreover, the branching device may also be provided with a ground line. The main transmission line includes respective connectors at either end, and thus a connection point of another device can be easily connected using a simple procedure.

The branching device also includes a first branch transmission line that branches from an intermediate point of the signal lines. A branch-use connector is provided at the end of the first branch transmission line, and a monitoring apparatus, for example, can be easily connected thereto. In order to improve interchangeability, the shape of the branch-use connector may be made the same as that of the main transmission line. Alternatively, the connectors may be made with different shapes in order to prevent mis-connection.

The branching device also includes a second branch transmission line that branches from an intermediate point of the signal lines. A branch-use terminal block is provided at the end of the second branch transmission line. Any chosen device may be connected to the branch-use terminal block. Moreover, branch-use terminals are provided on the branch-use terminal block. It is possible to connect (1) a signal line whose terminal end has been fitted with an alligator clip, an amp terminal, or the like, or (2) a bare signal line which has had the insulation stripped from its end to the branch-use terminals.

The branching device also includes a terminating resistor which preferably has a resistance that matches the standard used in the information transmission system of the transmission line. Further, a plurality of terminating resistors may be provided. This allows a range of standard resistances to be provided that match those used in the information transmission systems of various devices. Note that, one end of each terminating resistor is connected to one of the signal lines.

Moreover, the branching device also includes a selection switch that is operated to connect the other end of the terminating resistor with an other one of the signal lines, or to form an open circuit. In the case where the plurality of the terminating resistors are provided, the selection switch is operated to connect the other end of any one of the terminating resistors with the other one of the signal lines, or to form an open circuit. Furthermore, in the case that none of the devices connected to the ends of the main transmission line, the first branch transmission line, or the second branch transmission line has a terminating resistor, the selection switch can be operated so as to connect the device to a terminating resistor that is suitable for the transmission system thereof. In addition, if any one of the devices does have a terminating resistor, or uses a transmission system that does not require a terminating resistor, the selection switch can be operated to the open circuit position. Accordingly, operation of the selection switch allows the resistance between the signal lines to be suitably adjusted, whereby it is possible to transmit information reliably. Note that, for example, a rotary switch or a slide switch may be used for the selection switch.

General-use products manufactured in accordance with standard specifications may be used for the transmission line, the connectors, the branch-use terminal block, the terminating resistors, and the selection switch described-above. If such general-use products are used, the branching device may be embodied at low cost.

The main transmission line may further include separate parallel signal lines without branches, and the parallel signal lines and the signal lines may be connected between the connectors in a single bundle. Note that, if connectors are used that have sufficient pins to accommodate the largest number of parallel lines that it is thought will be used, it is possible to apply the branching device to a wide-range of uses. Further, the main transmission line may be a multi-core line in which all of the signal lines and the parallel transmission lines are bundled together. Alternatively, the main transmission line may include the signal lines and the parallel lines bundled separately.

In the case that the signal lines are used to perform Controller Area Network (CAN) communication, the terminating resistor may preferably have a resistance of 120 kΩ which is suitable for vehicle-use CAN communication. Moreover, if a plurality of terminating resistors are provided, it is preferable that at least one of the resistances is 120 kΩ.

The embodiment also provides a monitoring apparatus including the above-configured branching device for a transmission line. This monitoring apparatus can be applied to, for example, an information transmission terminal with CAN communication specifications by connecting the terminal to the branch-use connector or the branch-use terminal block.

Further, if the above-described branching device for a transmission line and the monitoring apparatus including the same are applied to CAN communication between a vehicle and a service tool, it is not necessary to modify the vehicle's wiring in order to connect the monitoring apparatus. Moreover, the standard resistance for a terminating resistor used in CAN communication is 120 kΩ. It is easily possible to switch to this resistance using the selection switch. Accordingly, when various different devices are connected in a bench test and CAN communication is performed, if there is a terminating resistor in the devices, the selection switch is turned to the open circuit position. On the other hand, if there is no terminating resistor in the devices, they are connected with the 120 kΩ resistance by turning the selection switch thereto. As a result there is no need to go through the troublesome procedure of preparing, and attaching and removing, a terminating resistor as is the case conventionally. Further, there is K-line communication different from CAN communication, and the resistance value of the terminating register R2 corresponds to the resistance value of K-line communication.

Furthermore, commands may be sent to the first branch transmission line or the second branch transmission line from the monitoring apparatus. The commands may then be transmitted to an electronic control device in the vehicle or the service tool via the main transmission line.

The branching device for a transmission line includes the branch-use connector and the branch-use terminal block of the branched signal lines, and is configured such that the selection switch can be switched to either the terminating resistor or the open circuit position. Accordingly, it is possible to connect a general-use monitoring apparatus to the branch-use connector. Further, in the case of a specialist device with a connector that does not match, the terminal end of the transmission line can be modified to allow connection to the branch-use terminal block. As a result, information transmission of the signal line can be monitored, and commands sent.

Moreover, the branching device for a transmission line according to the invention, and the monitoring apparatus including the same can be applied to CAN communication between a vehicle and a service tool. Therefore, it is not necessary to modify the vehicle's wiring or go through the troublesome procedure of preparing, and attaching and removing, a terminating resistor, and thus vehicle development efficiency is improved.

What is claimed is:

1. A branching device for a transmission line, comprising:
    a main transmission line including at least two signal lines and having respective connectors provided at either end;
    a first branch transmission line comprising a branch-use connector at an end, and at least two branch wires, each branch wire branching from a respective signal line;
    a second branch transmission line comprising a branch-use terminal block at an end, and at least two branch wires, each branch wire branching from a respective signal line;
    a terminating resistor having one end connected to one of the signal lines that branches into both the first branch transmission line and the second branch transmission line; and
    a selection switch that is operated to connect the other end of the terminating resistor with an other one of the signal lines that branches into both the first branch transmission line and the second branch transmission line.

2. The branching device for a transmission line according to claim 1, wherein the terminating resistor is provided as a plurality of terminating resistors, and the selection switch is operated to connect the other end of any one of the terminating resistors with the other one of the signal lines that branches into both the first branch transmission line and the second branch transmission line.

3. The branching device for a transmission line according to claim 1, wherein the main transmission line includes separate parallel signal lines without branches, and the parallel signal lines and the signal lines are connected between the connectors in a single bundle.

4. The branching device for a transmission line according to claim 2, wherein the main transmission line includes separate parallel signal lines without branches, and the parallel signal lines and the signal lines are connected between the connectors in a single bundle.

5. The branching device for a transmission line according to claim 1, wherein the signal lines are used to perform vehicle-use controller area network communication, and the terminating resistor has a resistance of one hundred and twenty kilo ohms which is suitable for vehicle-use controller area network communication.

6. The branching device for a transmission line according to claim 3, wherein the signal lines are used to perform vehicle-use controller area network communication, and the terminating resistor has a resistance of one hundred and twenty kilo ohms which is suitable for vehicle-use controller area network communication.

7. The branching device for a transmission line according to claim 2, wherein the signal lines are used to perform vehicle-use controller area network communication, and at least one of the plurality of terminating resistors has a resistance of one hundred and twenty kilo ohms which is suitable for vehicle-use controller area network communication.

8. The branching device for a transmission line according to claim 4, wherein the signal lines are used to perform vehicle-use controller area network communication, and at least one of the plurality of terminating resistors has a resistance of one hundred and twenty kilo ohms which is suitable for vehicle-use controller area network communication.

9. A monitoring apparatus including the branching device for a transmission line according to claim 5, wherein one of the branch-use connector and the branch-use terminal block is used to monitor information transmission of the main transmission line performed using vehicle-use controller area network communication, and to send commands.

10. A monitoring apparatus including the branching device for a transmission line according to claim 6, wherein one of the branch-use connector and the branch-use terminal block is used to monitor information transmission of the main transmission line performed using vehicle-use controller area network communication, and to send commands.

11. A monitoring apparatus including the branching device for a transmission line according to claim 7, wherein one of the branch-use connector and the branch-use terminal block is used to monitor information transmission of the main transmission line performed using vehicle-use controller area network communication, and to send commands.

12. A monitoring apparatus including the branching device for a transmission line according to claim 8, wherein one of the branch-use connector and the branch-use terminal block is used to monitor information transmission of the main transmission line performed using vehicle-use controller area network communication, and to send commands.

13. A device for monitoring or testing components, comprising:
    a first line;
    a second line;
    a ground line;
    a plurality of signal lines;
    a first connector connected at one end of the first, second, ground and signal lines;
    a second connector connected at an opposite end of the first, second, ground and signal lines;
    a plurality of resistors, one end of each resistor connected to the first line;
    a rotary switch having a connection for each resistor at each resistor's opposite end and an open position, a fixed end of the rotary switch connected to the second line; and
    at least two branch transmission lines, each branch transmission line having three lines, a line connected at one end to each of the first, second and ground lines, and an opposite end of the three lines connected to a terminal block.

14. The device according to claim 13, wherein one resistor of the plurality of resistors is a one hundred and twenty kilo ohm resistor.

15. The device according to claim 13, further comprising a relay unit containing the plurality of resistors, the rotary switch, and the at least two branch transmission lines, wherein the first, second, ground and signal lines form a main transmission line passing through the relay unit.

16. The device according to claim 15, wherein one of the at least two branch transmission lines has a terminal for each of the three lines to comprise the terminal block.

* * * * *